United States Patent [19]

Miki et al.

[11] Patent Number: 5,631,579

[45] Date of Patent: May 20, 1997

[54] OUTPUT BUFFER CIRCUIT FOR INTERFACING SEMICONDUCTOR INTEGRATED CIRCUITS OPERATING ON DIFFERENT SUPPLY VOLTAGES

[75] Inventors: Takahiro Miki; Hiroyuki Kouno; Yasuyuki Nakamura, all of Hyogo, Japan

[73] Assignee: Mitsubishi Denki Kabushiki Kaisha, Tokyo, Japan

[21] Appl. No.: 548,066

[22] Filed: Oct. 25, 1995

[30] Foreign Application Priority Data

Nov. 21, 1994 [JP] Japan ................... 6-286821(P)

[51] Int. Cl.$^6$ ........................... H03K 19/0185
[52] U.S. Cl. ................... 326/58; 326/81; 326/83
[58] Field of Search .................. 326/80, 81, 83, 326/87, 56, 57, 58, 120; 327/108, 112, 333

[56] References Cited

U.S. PATENT DOCUMENTS

| 4,384,220 | 5/1983 | Segawa et al. | 326/120 |
|---|---|---|---|
| 4,578,694 | 3/1986 | Ariizumi et al. | 326/120 |
| 4,595,845 | 6/1986 | Briggs | 326/113 |
| 4,806,798 | 2/1989 | Kanauchi | 326/120 |
| 4,963,766 | 10/1990 | Lundberg | 326/58 |
| 5,057,715 | 10/1991 | Larsen et al. | 326/121 |
| 5,124,585 | 6/1992 | Kim et al. | 326/80 |
| 5,150,186 | 9/1992 | Pinney et al. | 326/112 |
| 5,151,619 | 9/1992 | Austin et al. | 326/86 |
| 5,311,076 | 5/1994 | Park et al. | 326/57 |
| 5,418,480 | 5/1995 | Hastie et al. | 326/113 |
| 5,488,326 | 1/1996 | Shiraishi et al. | 326/81 |

FOREIGN PATENT DOCUMENTS 57-3431  1/1982  Japan ...................... 326/58

OTHER PUBLICATIONS

Sedra et al.; "Microelectronic Circuits"; copyright 1987 by Holt, Rinehart and Winston, Inc.; pp. 331 and 344.
Wakerly, John F.; "Digital Design Principles and Practices"; copyright 1989 by John F. Wakerly; pp. 214-217.
"A 200-MH$_z$ 64-b Dual-Issue CMOS Microprocessor", Dobberpuhl et al., *IEEE Journal of Solid-State Circuits*, vol. 27, No. 11, Nov. 1992, pp. 1555-1567.
Principles of CMOS VLSI Design, Weste et al., pp. 229-230; ©1985 by AT&T Bell Laboratories, Inc. and Kamran Eshraghian.

*Primary Examiner*—Edward P. Westin
*Assistant Examiner*—Benjamin D. Driscoll
*Attorney, Agent, or Firm*—Lowe, Price, LeBlanc & Becker

[57] ABSTRACT

An output buffer circuit operating normally when its supply potential is exceeded by the potential of the bus to which the buffer circuit output is connected. The circuit comprises a p-channel MOS transistor and a first and a second n-channel MOS transistor. The output node of the output buffer circuit is connected not to the p-channel MOS transistor but to the connection point between the source of the first n-channel MOS transistor and the drain of the second n-channel MOS transistor. The threshold potential of the first n-channel MOS transistor is set so that, with the output node in the high-impedance state, the first n-channel MOS transistor is turned off when the output node potential exceeds the supply potential of the output buffer circuit. This prevents the p-channel MOS transistor from getting activated or from being forward-biased between the back gate and the drain or source. Thus no leak current flows when the bus potential becomes higher than the supply potential of the output buffer circuit.

9 Claims, 11 Drawing Sheets

| S103 | HZ | D | HZB | DP | DN | Tr1 | Tr2 | Tr10 | S3 | BUS |
|---|---|---|---|---|---|---|---|---|---|---|
| Z | 0 | 0 | 1 | 1 | 1 | off | on | on | 0 | 0 |
| Z | 0 | 1 | 1 | 0 | 0 | on | off | on | 1 | 1 |
| 0 | 1 | 0 | 0 | 1 | 0 | off | off | on | Z | 0 |
| 0 | 1 | 1 | 0 | 1 | 0 | off | off | on | Z | 0 |
| 1 | 1 | 0 | 0 | 1 | 0 | off | off | off | Z | 1 |
| 1 | 1 | 1 | 0 | 1 | 0 | off | off | off | Z | 1 |

| S103 | HZ | D | HZB | DB | DN | Tr1 | Tr2 | Tr11 | S3 | BUS |
|---|---|---|---|---|---|---|---|---|---|---|
| Z | 0 | 0 | 1 | 1 | 1 | off | on | on | 0 | 0 |
| Z | 0 | 1 | 1 | 0 | 0 | on | off | on | 1 | 1 |
| 0 | 1 | 0 | 0 | 1 | 0 | off | off | off | Z | 0 |
| 0 | 1 | 1 | 0 | 0 | 0 | on | off | off | Z | 0 |
| 1 | 1 | 0 | 0 | 1 | 0 | off | off | off | Z | 1 |
| 1 | 1 | 1 | 0 | 0 | 0 | on | off | off | Z | 1 |

| S103 | HZ | D | HZB | DB | DN | Tr1 | Tr2 | Tr91 | Tr92 | Tr11 | S3 | BUS |
|---|---|---|---|---|---|---|---|---|---|---|---|---|
| Z | 0 | 0 | 1 | 1 | 1 | off | on | off | on | on | 0 | 0 |
| Z | 0 | 1 | 1 | 0 | 0 | on | off | off | on | on | 1 | 1 |
| 0 | 1 | 0 | 0 | 1 | 0 | off | off | on | off | off | Z | 0 |
| 0 | 1 | 1 | 0 | 0 | 0 | on | off | on | off | off | Z | 0 |
| 1 | 1 | 0 | 0 | 1 | 0 | off | off | on | off | off | Z | 1 |
| 1 | 1 | 1 | 0 | 0 | 0 | on | off | on | off | off | Z | 1 |

| S103 | HZ | D | HZB | DP | DN | Tr1 | Tr2 | Tr12 | S3 | BUS |
|------|----|----|-----|----|----|-----|-----|------|----|----|
| Z | 0 | 0 | 1 | 1 | 1 | off | on | on | 0 | 0 |
| Z | 0 | 1 | 1 | 0 | 0 | on | off | on | 1 | 1 |
| 0 | 1 | 0 | 0 | 1 | 0 | off | off | on | Z | 0 |
| 0 | 1 | 1 | 0 | 1 | 0 | off | off | on | Z | 0 |
| 1 | 1 | 0 | 0 | 1 | 0 | off | off | off | Z | 1 |
| 1 | 1 | 1 | 0 | 1 | 0 | off | off | off | Z | 1 |

FIG. 12
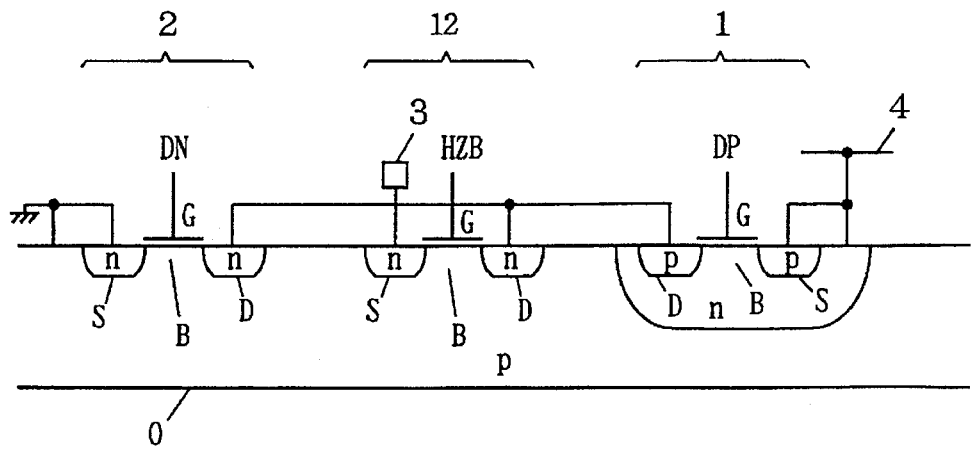
FIG. 13
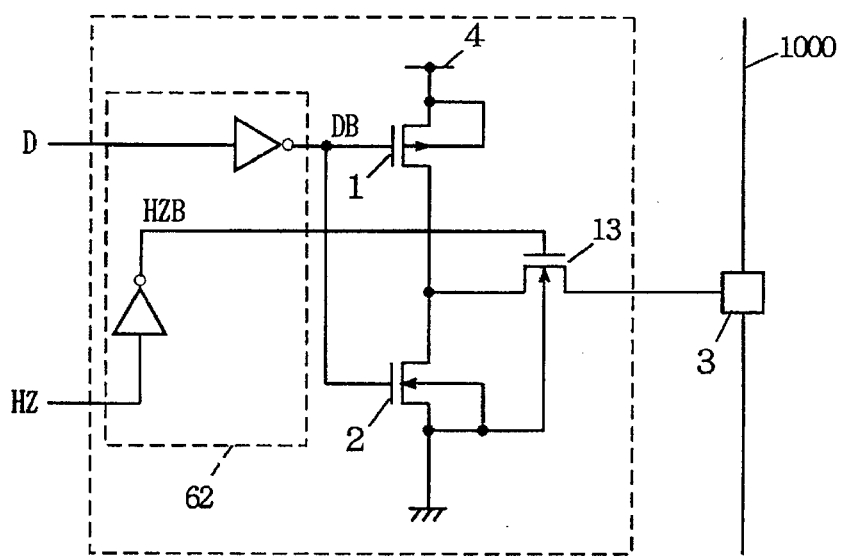
FIG. 14
| S103 | HZ | D | HZB | DB | Tr1 | Tr2 | Tr13 | S3 | BUS |
|------|----|----|-----|----|-----|-----|------|----|-----|
| Z | 0 | 0 | 1 | 1 | off | on | on | 0 | 0 |
| Z | 0 | 1 | 1 | 0 | on | off | on | 1 | 1 |
| 0 | 1 | 0 | 0 | 1 | off | on | off | Z | 0 |
| 0 | 1 | 1 | 0 | 0 | on | off | off | Z | 0 |
| 1 | 1 | 0 | 0 | 1 | off | on | off | Z | 1 |
| 1 | 1 | 1 | 0 | 0 | on | off | off | Z | 1 |

| S103 | HZ | D | HZB | DB | Tr1 | Tr2 | Tr91 | Tr92 | Tr13 | S3 | BUS |
|------|----|----|-----|----|-----|-----|------|------|------|----|-----|
| Z | 0 | 0 | 1 | 1 | off | on | off | on | on | 0 | 0 |
| Z | 0 | 1 | 1 | 0 | on | off | off | on | on | 1 | 1 |
| 0 | 1 | 0 | 0 | 1 | off | on | on | off | off | Z | 0 |
| 0 | 1 | 1 | 0 | 0 | on | off | on | off | off | Z | 0 |
| 1 | 1 | 0 | 0 | 1 | off | on | on | off | off | Z | 1 |
| 1 | 1 | 1 | 0 | 0 | on | off | on | off | off | Z | 1 |

| S103 | HZ | D | HZB | DP | DN | Tr1 | Tr2 | S3 | BUS |
|---|---|---|---|---|---|---|---|---|---|
| Z | 0 | 0 | 1 | 1 | 1 | off | on | 0 | 0 |
| Z | 0 | 1 | 1 | 0 | 0 | on | off | 1 | 1 |
| 0 | 1 | 0 | 0 | 1 | 0 | off | off | Z | 0 |
| 0 | 1 | 1 | 0 | 1 | 0 | off | off | Z | 0 |
| 1 | 1 | 0 | 0 | 1 | 0 | off | off | Z | 1 |
| 1 | 1 | 1 | 0 | 1 | 0 | off | off | Z | 1 |

FIG. 20       PRIOR ART
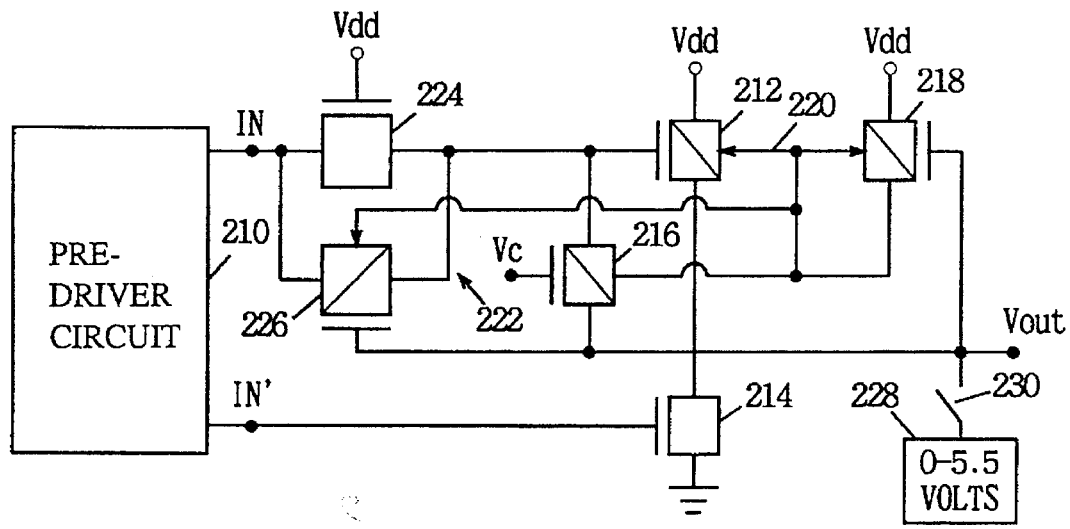
FIG. 21       PRIOR ART
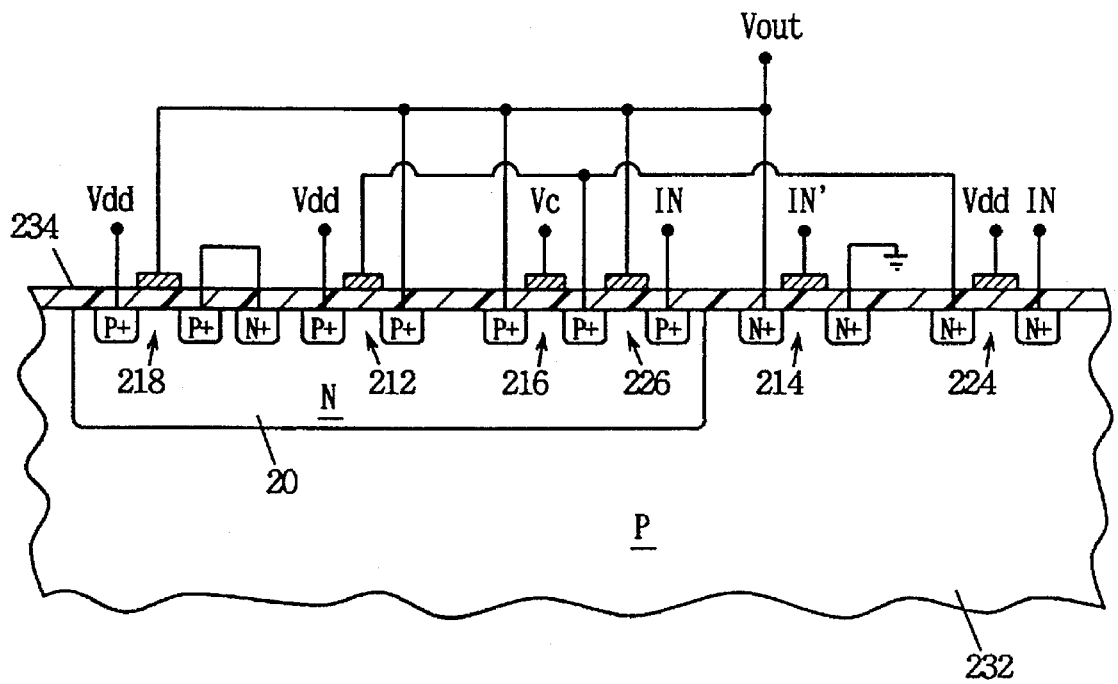

1

OUTPUT BUFFER CIRCUIT FOR INTERFACING SEMICONDUCTOR INTEGRATED CIRCUITS OPERATING ON DIFFERENT SUPPLY VOLTAGES

BACKGROUND OF THE INVENTION

1. Field of the Invention

The present invention relates to an output driver circuit such as an output buffer circuit in semiconductor integrated circuits. More particularly, the invention relates to an output buffer circuit for use in an integrated circuit operating on a supply voltage lower than those of other integrated circuits connected to the output bus within a system that mixedly comprises semiconductor integrated circuits operating on different supply voltages.

2. Description of the Related Art

Transistors in semiconductor integrated circuits have been progressively reduced in size in keeping with the growing degree of circuit integration. In the face of this trend, it is preferred to lower the supply voltage to the integrated circuit so as to minimize any deterioration in the reliability of transistors therein caused by the so-called hot electron effect. As the supply voltage is lowered, so are the power consumption and the circuit switching speed of the integrated circuit involved.

MOS integrated circuits used to operate on a supply voltage of 5 V. Today, many of the MOS devices are designed to run on the supply voltage of as low as 3.3 V.

Reductions in the supply voltage not only minimize the hot electron effect on transistors; they also lower power dissipation per transistor in the integrated circuit. This means that, where numerous transistors are integrated on a single chip, the power consumption per unit area of the chip may be reduced appreciably. This is an important factor affecting the scale of integration and the operating speed of the integrated circuit.

Meanwhile, where a system is configured using a plurality of semiconductor integrated circuits, some of the configured circuits may operate on different supply voltages because the transistor-transistor logic (TTL) runs on the 5-volt power supply. In that case, it is customary for those circuits operating on the different supply voltages to connect with a common bus in the system.

FIG. 17 is a schematic block diagram of a conventional system wherein semiconductor integrated circuits operate on different supply voltages (this is a first conventional example). In FIG. 17, integrated circuits 7 and 107 operate on different supply voltages and are connected to a common bus 1000.

The integrated circuit 7 operates on a first supply voltage of, say, 3.3 V. An output buffer circuit 5 in the integrated circuit 7 is controlled by internal signals D and HZ. The output buffer circuit 5 outputs its signal to an output node 3. The internal signal D is a data signal that represents a first and a second logical level output to the output node 3. The internal signal HZ is a signal that puts the output node 3 in the high-impedance state.

The output buffer circuit 5 comprises a control circuit 6, a p-channel MOS transistor 1 and an n-channel MOS transistor 2. The back gates of these transistors are connected to their respective sources. The common drain of these transistors is connected to the output node 3. The source of the n-channel MOS transistor 2 is connected to ground, while the source of the p-channel MOS transistor 1 is connected to a power line 4.

2

The control circuit 6 comprises a NAND gate 601, a NOR gate 602 and an inverter 603. The internal signal D is input to a first input of the NAND gate 602 and to a first input of the NOR gate 602. The internal signal HZ is input to a second input of the NAND gate 601 via the inverter 603 and a second input of the NOR gate 602. The output signal DP of the NAND gate 601 is input to the gate of the p-channel MOS transistor 1. The output signal DN of the NOR gate 602 is input to the gate of the n-channel MOS transistor 2.

The integrated circuit 107 is suitably constituted to operate on a second supply voltage of, say, 5 V. An output buffer circuit 105 in the integrated circuit 107 is the same in constitution as the output buffer circuit 5 in the integrated circuit 7, except that the circuit 105 operates on the supply voltage of 5 V. Thus the output buffer circuit 105 will not be discussed further. As with the integrated circuit 7, the output node 103 of the output buffer circuit 105 is connected to the bus 1000.

Below is a description of how the output buffer circuit 5 operates in response to the internal signals D and HZ. The basic operation of the output buffer circuit 5 is dependent on the logical values of the data signal D and impedance control signal HZ. That is, the output buffer circuit 5 selectively performs one of three functions at any one time: to bring the output node 3 high, to drive the output node 3 low, or to put the output node in the high-impedance state.

The control circuit 6 operates as follows: when the impedance control signal HZ is low, the control circuit 6 outputs the inverted logical values DP and DN of the data signal D. Specifically, if the data signal D is high, the output signals DP and DN are low; if the data signal D is low, the output signals DP and DN are high.

When the impedance control signal HZ is at the high level, the output signal DP is unconditionally high and the output signal DN is unconditionally low regardless of the logical value of the data signal D.

In response to the way the control circuit 6 operates, the output buffer circuit 5 operates as described below. First to be noted is how the p-channel MOS transistor 1 and the n-channel MOS transistor 2 operate when the impedance control signal HZ is low. If the data signal D is high, the p-channel MOS transistor 1 is turned on and the n-channel MOS transistor 2 is turned off. This gets a signal S3 of the output node 3 ready to go high. If the data signal D is low, the p-channel MOS transistor 1 is turned off and the n-channel MOS transistor 2 is turned off. This in turn gets the signal S3 of the output node 3 ready to go low.

In the above situation, if the output node 103 of the integrated circuit 107 is in the high-impedance state, the output of the output buffer circuit 5 is given priority. That is, the logical value BUS of the bus 1000 becomes the same as that of the signal S3.

If the impedance control signal HZ is at the high level, both the p-channel MOS transistor 1 and the n-channel MOS transistor 2 are turned off. This puts the output node 3 of the output buffer circuit 5 in the high-impedance state, disconnecting the circuit 5 electrically from the bus 1000. In that case, the logical value S103 of the output node 103 of the other integrated circuit 107 is given priority.

The above-described operation of the output buffer circuit 5 is summarized in the truth table of FIG. 18. Reference characters 1, 0 and Z represent the high level state, the low level state and the high-impedance state, respectively. Reference characters S103, S3 and BUS stand for the logical value of output 103 from other integrated circuit 107, the logical value of output node 3 and the logical value of bus line 1000, respectively. Reference characters Tr1 and Tr2 represent the on/off state of the transistor 1 and that of the transistor 2, respectively. FIG. 19 is a crosssectional view of the p-channel MOS transistor 1 and the n-channel MOS transistor 2 in the output buffer 5. Reference characters G, S, D and B stand for the gate, source, drain and back gate, respectively, of each of the transistors. Reference characters p and n represent a p-type and an n-type semiconductor region, respectively.

The integrated circuit 107 operates on a supply voltage higher than that of the integrated circuit 7. When the circuit 107 is disconnected electrically from the bus 1000, i.e., when the output node 3 of the integrated circuit 7 outputs a high-level or a low-level signal, the circuit of FIG. 19 works normally.

On the other hand, with the output buffer circuit 5 in the high-impedance state (i.e., signal HZ driven high), it may happen that the integrated circuit 107 outputs a high-level signal while the supply voltage of the circuit 107 remains higher than that of the output buffer circuit 5. In that case, an irregularity occurs.

That is, in FIG. 19, the potential of the output node 3 becomes higher than that of the power line 4 of the output buffer circuit 5. This turns on the p-channel MOS transistor 1. Furthermore, the p-n junction between the drain and the n-well in the p-channel MOS transistor 1 is forward-biased because the potential of that drain is higher than that of the back gate. As a result of this, a current flows from the output node 3 to the power line 4.

More specifically, what happens is as follows: in FIG. 17, a large leak current flows from the power supply of the other integrated circuit 107 to the power line 4 of the output buffer circuit 5 through the output node 103 of the integrated circuit 107, the bus 1000, the output node of the integrated circuit 7, and the drain and back gate of the p-channel MOS transistor 1 in the output buffer circuit 5.

The leak current in turn can lead to an abnormal increase in the power consumption of the integrated circuit 107 and also result in fused or severed wiring in the current transmission path.

One solution to the above problem is disclosed in U.S. Pat. No. 5,151,619 (a second conventional example). FIG. 20 is a schematic block diagram of the disclosed circuit constitution. In FIG. 20, a rectangle having a diagonal line inside and a gate electrode nearby indicates a p-channel MOS transistor; a rectangle with a gate electrode nearby represents an n-channel MOS transistor.

In this output buffer circuit, the basic component is made of a pull-up p-channel MOS transistor 212 and a pull-down n-channel MOS transistor 214 connected in series. The source of the p-channel MOS transistor 212 is fed with a supply voltage $V_{dd}$. The source of the n-channel MOS transistor 214 is connected to ground. The common drain of the two transistors is connected to an output node $V_{out}$.

A pre-driver circuit 210 corresponds to the control circuit 6 in the first conventional example. When signal IN and IN' turn on and off the p-channel MOS transistor 212 and n-channel MOS transistor 214 in a complementary manner, a first and a second logical levels are output to the output node $V_{out}$. When the two transistors are simultaneously turned off, the output node $V_{out}$ is put in the high-impedance state.

The second conventional example differs from the first example in three major aspects. One difference is that a p-channel MOS transistor 216 whose gate is fed with a reference potential $V_c$ is connected interposingly between the output node $V_{out}$ and the gate electrode of the p-channel MOS transistor 212.

Another difference is that an n-well is connected to the supply potential $V_{dd}$ by way of a p-channel MOS transistor 218. The source, drain and gate of the p-channel MOS transistor 218 are connected to the supply potential $V_{dd}$, n-well 220 and output node $V_{out}$, respectively.

A further difference is that the output IN of the pre-driver circuit (corresponding to the control circuit 6 in FIG. 17) is connected to the gate of the p-channel MOS transistor 212 via a transmission gate 222. The transmission gate 222 is structured as follows:

The transmission gate 222 includes an n-channel MOS transistor 224 connected interposingly between the output IN of the pre-driver circuit and the gate of the p-channel MOS transistor 212. The gate of the n-channel MOS transistor 224 is biased to the supply potential. The transmission gate 222 also includes a p-channel MOS transistor 226 connected parallelly to the n-channel MOS transistor 224. The gate of the p-channel MOS transistor 226 is connected to the output node $V_{out}$.

FIG. 21 is a cross-sectional view of the transistors constituting the circuit of FIG. 20. How the second conventional example operates will now be described with reference to FIGS. 20 and 21. It is assumed hereunder that the reference potential $V_c$ is equal to the supply potential $V_{dd}$. It is also assumed that the supply potential $V_{dd}$ is 3.6 V and that the output node $V_{out}$ is supplied with 0 V or 5.5 V from a second circuit 228 through a switch 230 which is opened and closed.

When the gate potential of the p-channel MOS transistor 212 is high (3.6 V) and the gate potential of the n-channel MOS transistor 214 is low (0 V), the output of the circuit in FIG. 20 is in the high-impedance state. In that state, closing the switch 230 feeds the voltage of 0 V or 5.5 V from the external circuit 228 to the output node $V_{out}$.

When the voltage fed to the output node $V_{out}$ is raised to a threshold voltage higher than the voltage $V_c$ ($=V_{dd}$), the p-channel MOS transistor 216 is turned on. This raises the gate potential of the p-channel MOS transistor 212 up to the potential of the output node $V_{out}$.

Because the source/n-well junction of the p-channel MOS transistor 216 is forward-biased, a current flows through the n-well 220. This raises the potential of the n-well 220, which is electrically floating, to the level of the voltage of the output node $V_{out}$ minus the threshold voltage of the p-n junction.

Because the p-channel MOS transistor 212 is located in the n-well 220, a positive voltage develops between the gate electrode and the source. This allows the p-channel MOS transistor 212 to remain off, preventing the current to flow toward the power supply $V_{dd}$.

With the gate potential of the p-channel MOS transistor 212 raised, the n-channel MOS transistor 224 is turned off as well. This prevents any current from flowing to the pre-driver circuit 210. Needless to say, the p-channel MOS transistor 226 is also off at this point.

If the p-channel MOS transistor 226 is absent from the transmission gate 222 which then would consist of the n-channel MOS transistor 224 alone, the potential of the signal IN will be lowered by the amount equivalent to the threshold voltage of the absent transistor. A full-swing signal is fed to the gate of the pull-up transistor 212 only when the transmission gate 222 is furnished with the n-channel MOS transistor 224 whose gate is biased to the potential $V_{dd}$ as well as the p-channel MOS transistor 226 whose gate is biased to the output node $V_{out}$.

With all their improvements, the first and the second conventional example outlined above still have three major disadvantages between them.

The first conventional example has two disadvantages. One is that with the output node 3 of the output buffer circuit 5 placed in the high-impedance state, the p-channel MOS transistor 1 is turned on when the output node voltage becomes higher than the supply voltage of the circuit 5. This makes it impossible to maintain the high-impedance state.

The other disadvantage of the first conventional example is that with the high-impedance state removed, the p-n junction between the drain and the n-well of the p-channel MOS transistor 1 is forward-biased. The path thus formed also lets a leak current flows therethrough.

The major disadvantage of the second conventional example is that the measures taken to overcome the above two problems make the circuit constitution complicated. This leads to a growing number of transistors in, and a wider layout area of, the output buffer circuits required.

SUMMARY OF THE INVENTION

It is therefore an object of the present invention to provide an output buffer circuit of an integrated circuit operating on a supply voltage lower than those of other integrated circuits constituting an integral system, wherein the output buffer circuit in question operates normally even when the potential of its output node becomes higher than the supply voltage to the buffer circuit.

It is another object of the present invention to provide an output buffer circuit which ensures normal operation in the situation envisaged for the above object and which minimizes the increase in the number of component transistors and suppresses the widening of the output buffer circuit area.

In carrying out the invention and according to one aspect thereof, there is provided an output buffer circuit for switching the level of an output signal to one of a first logical level, a second logical level and a high-impedance state in response to an externally input signal. This output buffer circuit comprises a p-channel MOS transistor, a first n-channel MOS transistor, a second n-channel MOS transistor and an output node. The p-channel MOS transistor and the first n-channel MOS transistor are connected in series between a first supply potential and a second supply potential and are turned on and off in accordance with the externally input signal. The second n-channel MOS transistor is inserted in series between the p-channel MOS transistor and the first n-channel MOS transistor and is turned on and off in accordance with the externally input signal. The output node is connected to the connection point between the first and the second n-channel MOS transistor.

According to another aspect of the invention, there is provided an output buffer circuit for switching the level of an output signal to one of a first logical level, a second logical level and a high-impedance state in response to an externally supplied data signal and output impedance control signal. This output buffer circuit comprises a control circuit, a p-channel MOS transistor, a first n-channel MOS transistor, a second n-channel MOS transistor and an output node. The control circuit has its input receive the data signal and the output impedance control signal, and outputs control signals for controlling the state of the output signal. The p-channel MOS transistor has its gate receive the control signal and has its source fed with a first supply potential. The first n-channel MOS transistor has its gate receive the control signal and has its source fed with a second supply potential. The second n-channel MOS transistor has its gate receive a signal corresponding to the control signal, has its drain connected to the drain of the p-channel MOS transistor, and has its source connected to the drain of the first n-channel MOS transistor. The output node is connected to the drain of the first n-channel MOS transistor and to the source of the second n-channel MOS transistor.

According to a further aspect of the invention, there is provided an output buffer circuit for switching the level of an output signal to one of a first logical level, a second logical level and a high-impedance state in response to an externally input signal. This output buffer circuit comprises a p-channel MOS transistor, a first n-channel MOS transistor, an output node and a second n-channel MOS transistor. The p-channel MOS transistor and the first n-channel MOS transistor are connected in series between a first supply potential and a second supply potential and are turned on and off in accordance with the externally input signal. The second n-channel MOS transistor is inserted in series between the output node on the one hand, and the connection point between the p-channel MOS transistor and the first n-channel MOS transistor on the other hand, and is turned on and off in accordance with the externally input signal.

According to a still further aspect of the invention, there is provided an output buffer circuit for switching the level of an output signal to one of a first logical level, a second logical level and a high-impedance state in response to an externally supplied data signal and output impedance control signal. This output buffer circuit comprises a control circuit, a p-channel MOS transistor, a first n-channel MOS transistor, a second n-channel MOS transistor and an output node. The control circuit has its input receive the data signal and the output impedance control signal, and outputs a control signal for controlling the state of the output signal. The p-channel MOS transistor has its gate receive the control signal and has its source fed with a first supply potential. The first n-channel MOS transistor has its gate receive the control signal, has its drain connected to the drain of the p-channel MOS transistor, and has its source fed with a second supply potential. The second n-channel MOS transistor has its gate receive the control signal and has its drain connected to the drain of the p-channel MOS transistor and to the drain of the first n-channel MOS transistor. The output node is connected to the source of the second n-channel MOS transistor.

In a preferred structure according to the invention, the output buffer circuit further comprises a voltage converting circuit for generating a signal higher than the first supply potential. The second n-channel MOS transistor is an enhancement type transistor and has its gate driven by the signal generated by the voltage converting circuit.

As outlined, one major advantage of this invention is the capability of inhibiting the occurrence of a leak current in the output buffer circuit. This is achieved by getting the second n-channel MOS transistor of the output buffer circuit to cut off the output node potential becoming higher than the supply voltage of the buffer circuit. That is, with the output node placed in the high-impedance state, the threshold value of second n-channel MOS transistor is set so that the transistor will be turned off when the output node potential exceeds the supply potential of the output buffer circuit.

The above arrangement prevents the p-channel MOS transistor from getting activated while letting the p-n junction between the back gate and the source or drain of the n-channel MOS transistor remain reverse-biased if the output node potential exceeds the supply potential of the output buffer circuit. It follows that when the supply voltage of the output buffer circuit in any one integrated circuit connected to a bus is higher than in any other integrated circuit connected to the same bus, the power consumption of the other integrated circuit does not rise abnormally or its wiring does not fuse or sever.

Another advantage of this invention is that every n-channel MOS transistor in the output buffer circuit may be an enhancement type n-channel MOS transistor only. This means the elimination of manufacturing processes necessary for fabricating depletion type n-channel MOS transistors.

In addition, although the second n-channel MOS transistor is an enhancement type transistor, the gate input of the transistor is driven by a signal which is generated by a voltage converting circuit and is higher than the supply voltage. That is, when the gate potential of the second n-channel MOS transistor is at the high level, there occurs no voltage drop in this transistor. Thus when a high-level signal is output to the output node, the high-level signal potential appearing at the output node does not develop any voltage decrease.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 12 is a cross-sectional view of the fourth embodiment;

FIG. 13 is a circuit diagram of an output buffer circuit practiced as a fifth embodiment of the invention;

FIG. 14 is a truth table showing how the fifth embodiment operates;

FIG. 20 is a circuit diagram of an output buffer circuit given as the second conventional example; and FIG. 21 is a cross-sectional view of the second conventional example.

DESCRIPTION OF THE PREFERRED EMBODIMENTS

Figures 1, 2:
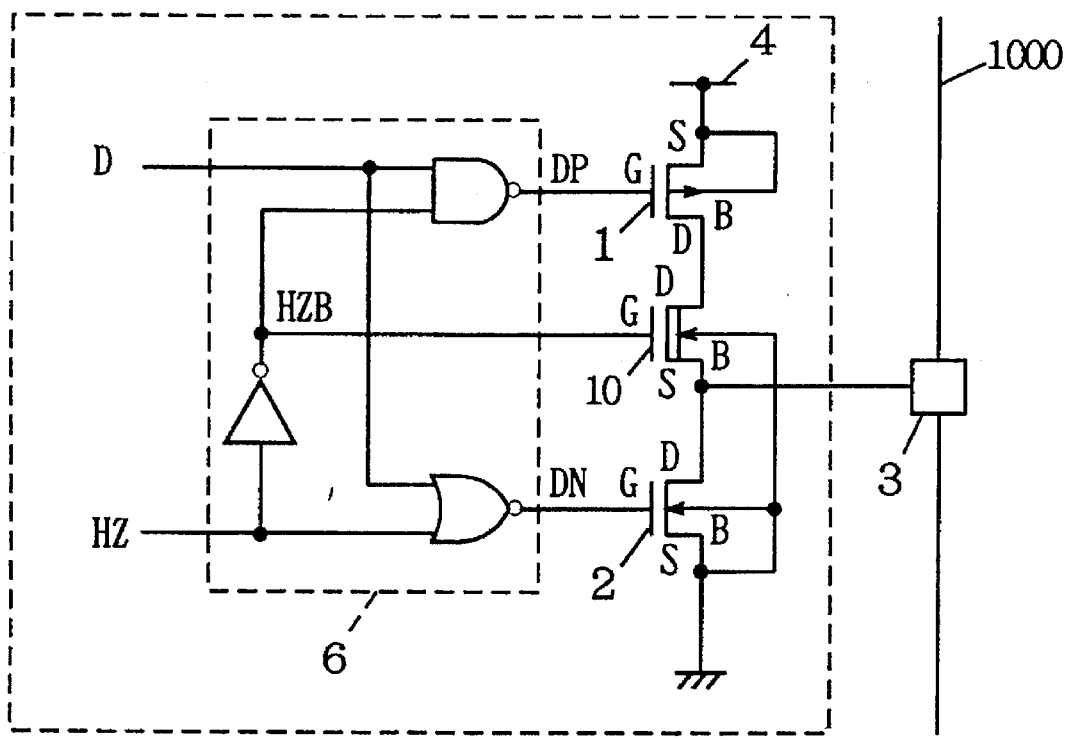
FIG. 1 is a circuit diagram of an output buffer circuit practiced as a first embodiment of the invention.
FIG. 2 is a truth table showing how the first embodiment operates.

FIG. 1 is a circuit diagram outlining the constitution of an output buffer circuit practiced as the first embodiment of the invention. The diagram shows only the components corresponding to the output buffer circuit 5 in the first conventional example in FIG. 17.

Figure 17:
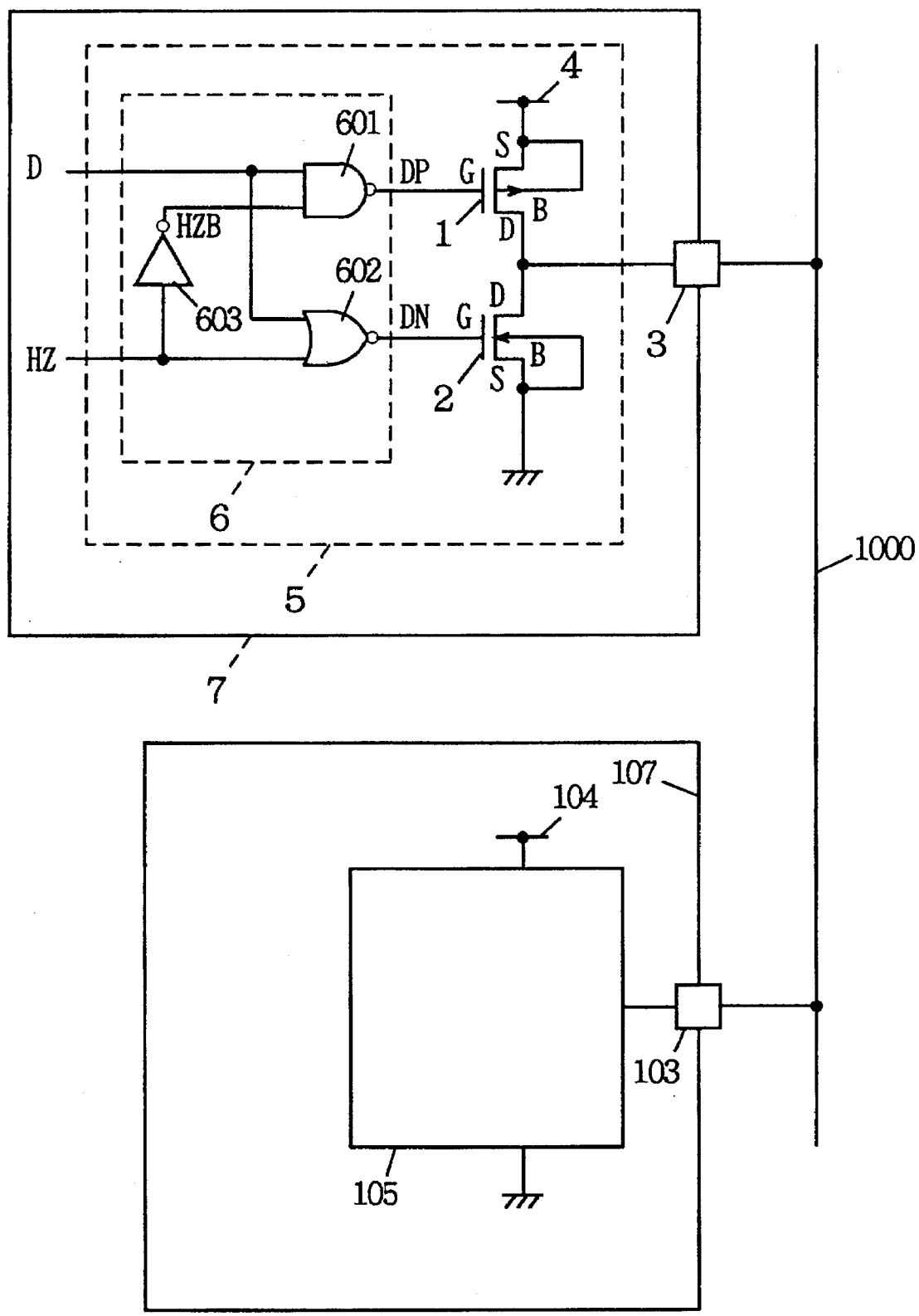
FIG. 17 is a circuit diagram of an output buffer circuit given as the first conventional example.

The first embodiment differs from the first conventional example of FIG. 17 in the following aspects: first, an n-channel MOS transistor 10 is interposed between the output node and the p-channel MOS transistor 1. Second, the gate of the n-channel MOS transistor 10 is fed with a signal HZB that is the inverted signal of the output impedance control signal HZ.

The n-channel MOS transistor 10 is a depletion type transistor. The threshold voltage $V_{th10}$ of this transistor is set to fall within the range defined as $$-V_{dd1} < V_{th10} < 0 \tag{1}$$

where, $V_{dd1}$ is the supply potential of the output buffer (i.e., potential of the power line 4).

The reason for using an n-channel MOS transistor as the transistor 10 is to avoid a setup having a p-channel MOS transistor connected direct to the output node 3. That is, if the p-channel MOS transistor were used, the p-n junction formed by the p$^+$layer of the drain and the n-well would be forward-biased when the potential of the output node becomes higher than the potential $V_{dd1}$.

The reason for using a depletion type transistor as the n-channel MOS transistor 10 ($V_{th10} < 0$) is to prevent the high-level output voltage of the output buffer circuit 5 from dropping when that output is effected.

The threshold value of the n-channel MOS transistor 10 must fulfill the requirement $$-V_{dd1} < V_{th10} \tag{1'}$$

because, when the output buffer circuit 5 is in the high-impedance state and when the potential of the bus 1000 becomes higher than the supply potential of the output buffer circuit 5, the n-channel MOS transistor 10 needs to be cut off so as to disconnect the p-channel MOS transistor 1 electrically from the output node 3.

Suppose that $V_g10$ and $V_{S10}$ stand for the gate potential and the source potential of the n-channel MOS transistor 10, respectively. In that case, to cut off this n-channel MOS transistor requires meeting the requirement $$V_{g10} - V_{S10} < V_{th10} \tag{2}$$

according to the definitions of the threshold value for n-channel MOS transistors. More specifically, what is required is as follows:

When the output buffer circuit is in the high-impedance state, the signal HZB is at the low level (=0 V). Hence $V_{g10}0$. Therefore, to achieve the cutoff state when $V_{S10} = V_{dd1}$ need only require fulfilling the relation:

$$-V_{dd1} < V_{th10}$$

Below is a detailed description of how the first embodiment operates, with the above-described reasons taken into account and with reference to FIGS. 1 and 2. The workings of the control circuit 6 are the same as in the conventional setup and will not be discussed further.

Suppose that the output impedance control signal HZ is at the low level and that the data signal D is also at the low level. In this case, as with the conventional setup, the p-channel MOS transistor 1 is turned off and the n-channel MOS transistor 2 is turned on. This causes the signal S3 appearing at the output node 3 to be at the low level regardless of the state of the n-channel MOS transistor 10.

Suppose now that the data signal D has its level changed to the high level while the signal HZ remains low. In this case, the p-channel MOS transistor 1 is turned on and the n-channel MOS transistor 2 is turned off.

Since the signal HZ remains at the low level, the signal HZB entered into the gate of the n-channel MOS transistor 10 is at the high level, and the transistor 10 remains on.

The potential of the output node thus rises until the transistor 10 is turned off or until the output potential reaches the supply potential. If the n-channel MOS transistor 10 is an enhancement type transistor, the transistor 10 will be turned off when the output potential reaches the level of $(V_{dd1}-V_{th10})$. No further rise will occur in the output potential.

However, the n-channel MOS transistor 10 in this case is a depletion type transistor. This means that the potential $V_{th10}$ is a negative value and that the potential $(V_{dd1}-V_{th10})$ at which the transistor 10 is turned off is higher than the potential $V_{dd1}$.

Therefore the transistor 10 is not turned off until the output potential reaches the supply potential. The high level to be output becomes equal to the supply potential.

Suppose now that the output impedance control signal HZ is at the high level. In this case, both the p-channel MOS transistor 1 and the n-channel MOS transistor 2 are turned off as in the conventional setup. The gate potential of the transistor 10 is at the low level (=0 V).

If the potential of the bus 1000 is 0 V in the above situation, the depletion type n-channel MOS transistor 10 is turned on while the p-channel MOS transistor 1 and the n-channel MOS transistor 2 remain off. This places the output node 3 in the high-impedance state.

As the potential of the bus 1000 starts rising from 0 V, the potential of the drain of the p-channel MOS transistor 1 also goes up as long as the transistor 10 remains on. When the bus potential reaches $-V_{th10}$, the n-channel MOS transistor 10 is turned off. This stops the rise in the drain potential of the p-channel MOS transistor 1. Meanwhile, according to the expression (1) above, the potential $-V_{th10}$ is below the supply voltage of the output buffer circuit 5. It follows that the drain potential of the p-channel MOS transistor 1 does not exceed the supply voltage of the output buffer circuit 5.

Thus even if the potential of the bus 1000 exceeds the supply potential $V_{dd1}$ of the output buffer circuit 5, the p-channel MOS transistor 1 will not be forward-biased between the drain and the back gate as has been the case with the conventional setup. No large current then flows through the parts associated with the p-channel MOS transistor 1.

Figures 18, 19:
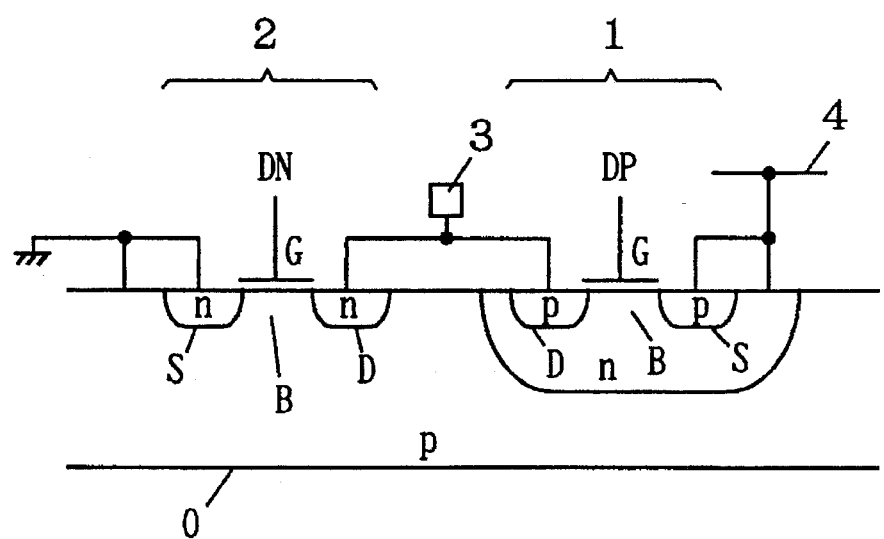
FIG. 18 is a truth table showing how the first conventional example operates.
FIG. 19 is a cross-sectional view of the first conventional example.

The above described operation of the output buffer circuit practiced as the first embodiment is summarized in the truth table of FIG. 2 The same reference characters denote the same or corresponding items in FIG. 18. The reference character Tr10 represents the on/off state of the transistor 10. Hereafter the reference character TrN (N: natural number) in the truth tables represents the on/off state of the transistor N, too.

Figure 3:
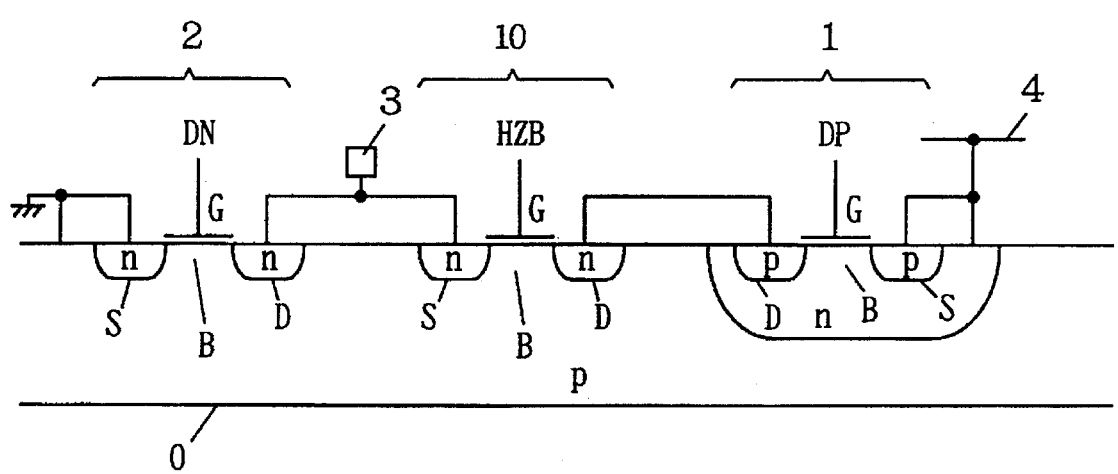
FIG. 3 is a cross-sectional view of the first embodiment.

FIG. 3 is a schematic cross-sectional view of the first embodiment comprising the p-channel MOS transistor 1, n-channel MOS transistor 1 and n-channel MOS transistor 2.

As shown in FIG. 3, it is n-type semiconductor regions that are connected to the output node. Applying a positive voltage to such regions does not cause a forward bias therebetween. Hence there flows no large current from the source to the back gate of the n-channel MOS transistor.

As a result, as long as the output impedance control signal HZ is at the high level, the output node 3 remains in the high-impedance state. This prevents the occurrence of a large leak current that is observed in the conventional setup.

Figures 4, 5:
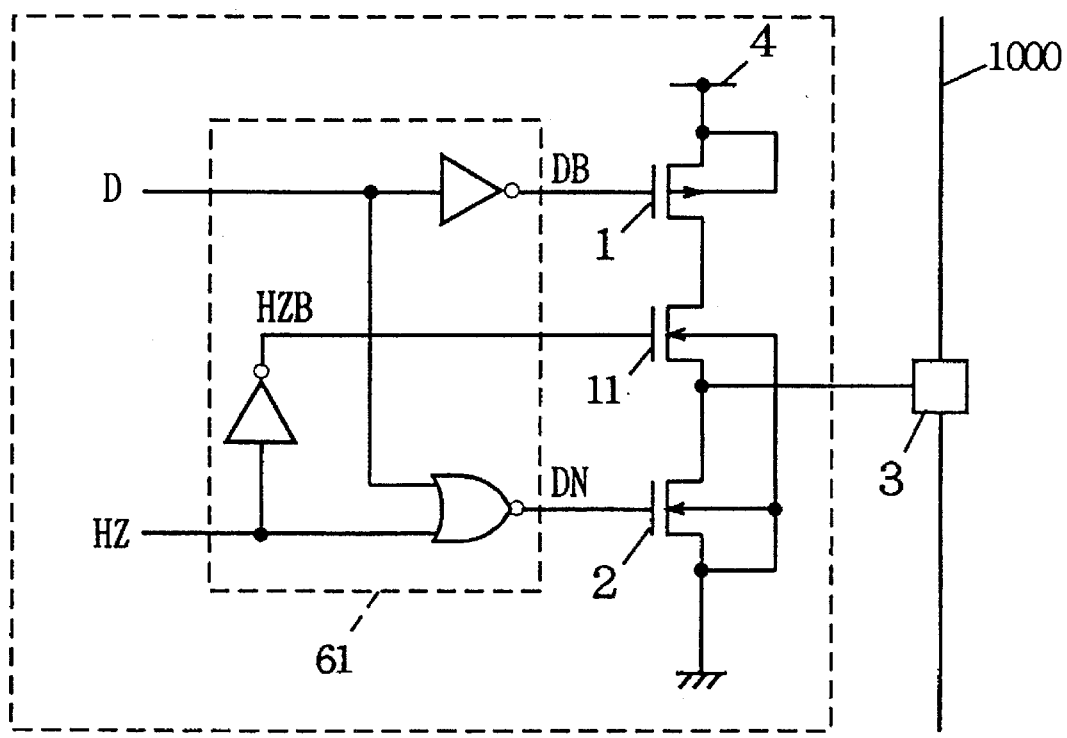
FIG. 4 is a circuit diagram of an output buffer circuit practiced as a second embodiment of the invention.
FIG. 5 is a truth table showing how the second embodiment operates.

FIG. 4 is a circuit diagram of an output buffer circuit practiced as the second embodiment of the invention. In the first embodiment of FIG. 1, the high-level output potential of the output buffer circuit 5 is kept from getting lower than the potential of the power line 4 but a depletion type n-channel MOS transistor is needed. If the high-level voltage is permitted to be lower than the potential of the power line 4, the depletion type transistor 10 may be replaced by an enhancement type transistor. With no need for fabricating depletion type n-channel MOS transistors, it is possible to use fewer masks in integrated circuit fabrication and to eliminate superfluous manufacturing processes such as ion implantation. This improves processing stability and results in appreciable economic benefits.

Employing enhancement type transistors instead of depletion type transistors provides another advantage; the control circuit may be constituted by use of fewer transistors, as will be explained below.

The second embodiment shown in FIG. 4 differs from the first embodiment in FIG. 1 in the following two aspects: first, the n-channel MOS transistor interposed between the output node 3 and the p-channel MOS transistor 1 is an enhancement type transistor 11. Second, the logic circuit of a control circuit 61 replaces the control circuit 6.

The control circuit 61 comprises one NOR gate and two inverters. In the control circuit 6 of the first embodiment, the signal entered into the gate of the p-channel MOS transistor 1 is generated by the NAND gate. In the control circuit 61 of the second embodiment, by contrast, the same signal is generated by an inverter. Generally, the NAND gate is made up of four transistors while the inverter is composed of two transistors. This means that the control circuit 61 has two transistors less than the control circuit 6.

How the second embodiment works will now be described with reference to FIGS. 4 and 5.The function of the control circuit 61 will be explained first. A signal DB is the inverted logic of the data signal D regardless of the value of the output impedance control signal HZ. As with the first embodiment, the signal HZB is the inverted logic of the output impedance control circuit HZ regardless of the value of the data signal D. And as with the first embodiment, the driving signal DN of the n-channel MOS transistor 2 becomes the inverted logic of the data signal D when the signal HZ is at the low level; the signal DN is driven unconditionally low when the signal HZ is at the high level.

Suppose that the output impedance control signal HZ and the data signal D are both at the low level. In that case, both the signal DB and the signal DN are high. This turns off the p-channel MOS transistor 1 and turns on the n-channel MOS transistor 2. As a result, the signal S3 acquired from the output node 3 is at the low level irrespective of the state of the transistor 11.

Suppose now that the data signal D has its state changed to the low level while the output impedance control signal HZ remains low. This brings both signals DB and DN low, thus turning on the p-channel MOS transistor 1 and turning off the n-channel MOS transistor 2. Since the signal HZ remains low, the signal HZB entered into the gate of the transistor 11 is at the high level, which means that the transistor 11 remains on. It is noted here that the n-channel MOS transistor 11 is an enhancement type transistor. Thus if the threshold voltage of the transistor 11 is $V_{th11}$ (a positive value), the transistor 11 is turned off when the potential of the output node 3 reaches the level of ($V_{dd1} - V_{th11}$). No further rise occurs in the output potential.

Suppose now that the output impedance control signal HZ is at the high level. In that case, the n-channel MOS transistor 2 remains off because the signal DN is at the low level regardless of the value of the signal D. The gate potential of the transistor 11, i.e., the signal HZB, is at the low level, which means the transistor 11 remains off.

At this point, the transistor 11 will not be turned on even if the potential of the bus 1000 is 0 V or exceeds the supply potential $V_{dd1}$. This is because the transistor 11 is an enhancement type n-channel MOS transistor.

Thus whatever state the p-channel MOS transistor 1 is in, the output of the output buffer circuit is placed in the high-impedance state. That is, the transistor 11 disconnects the p-channel MOS transistor 1 electrically from the bus 1000.

As described, when the output node is in the high-impedance state, the driving signal DB of the p-channel MOS transistor 1 may be in any state as long as the n-channel MOS transistor 11 remains off. Unlike the conventional setup or the first embodiment, the second embodiment has no need to get the driving signal DB generated by a NAND gate; the signal DB need only be a logical value generated by an inverter.

Figures 6, 7:
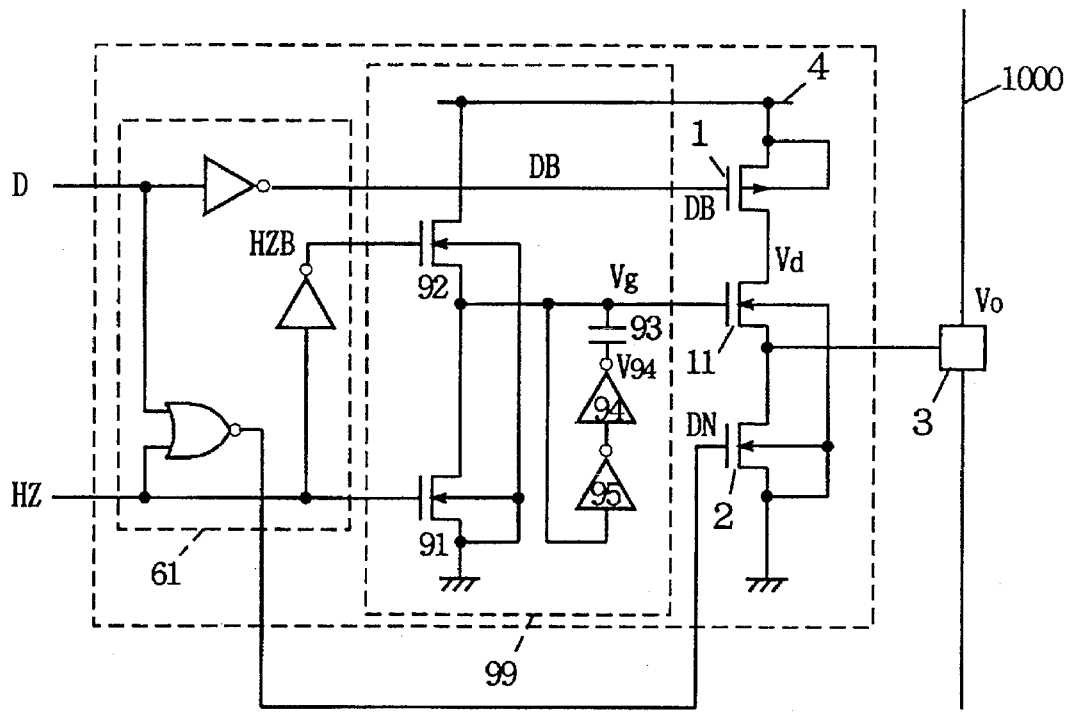
FIG. 6 is a circuit diagram of an output buffer circuit practiced as a third embodiment of the invention.
FIG. 7 is a truth table showing how the third embodiment operates.

FIG. 6 is a circuit diagram of an output buffer circuit practiced as the third embodiment of the invention. With the first embodiment, the high-level output potential of the output buffer circuit does not drop below the potential of the power line 4 but a depletion type n-channel MOS transistor is needed. With the second embodiment, an enhancement type n-channel MOS transistor is utilized but the high-level output potential of the output buffer circuit decrease below the potential of the power line 4.

Compared with the preceding embodiments, the third embodiment provides an output buffer circuit employing enhancement type transistors only. This eliminates the need for the process of fabricating depletion type n-channel MOS transistors. With the third embodiment, as will be explained later, the high-level output potential of the output buffer circuit does not drop below the potential of the power line 4.

The difference between the third embodiment shown in FIG. 6 and the second embodiment in FIG. 4 is that the third embodiment incorporates a voltage converting circuit 99 comprising n-channel MOS transistors 91 and 92, a capacitor 93, and inverters 94 and 95. The n-channel MOS transistor 11 interposed between the output node 3 and the p-channel MOS transistor 1 is the same enhancement type transistor as in the second embodiment. The other components including the control circuit are the same as those of the second embodiment.

How the third embodiment works will now be described with reference to FIGS. 6 and 7. When the output impedance control signal HZ is at the high level, the transistor 2 is turned off because the signal DN is low regardless of the logical value of the data signal D. At this point, the signal HZB is low, the transistor 91 is turned on and the transistor 92 is turned off. This drives the gate potential $V_g$ of the transistor 11 low (i.e., 0 V) and turns off the transistor 11.

In the above case, as with the second embodiment, the transistor 11 remains off even if the potential of the bus 1000 is 0 V or exceeds the supply potential $V_{dd1}$. This is because the transistor 11 is an enhancement type n-channel MOS transistor. Thus whatever state the p-channel MOS transistor 1 is in, the output of the output buffer circuit is placed in the high-impedance state. That is, the n-channel MOS transistor 11 disconnects the p-channel MOS transistor 1 electrically from the bus 1000.

Suppose now that the output impedance control signal HZ is brought low. In that case, the transistor 91 is turned off, the transistor 92 is turned on, and the gate potential $V_g$ of the transistor 11 starts to rise.

Figure 8:
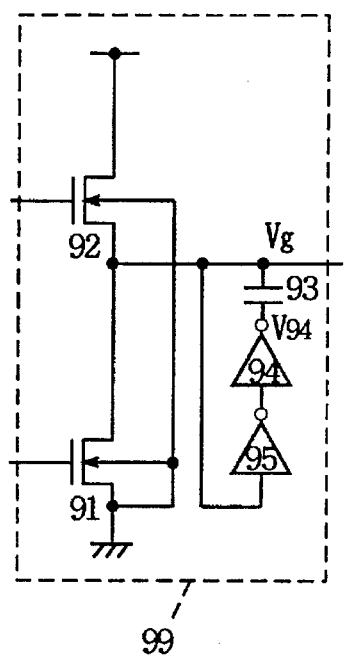
FIG. 8 is a circuit diagram of a step-up circuit in the third embodiment.
Figure 9:
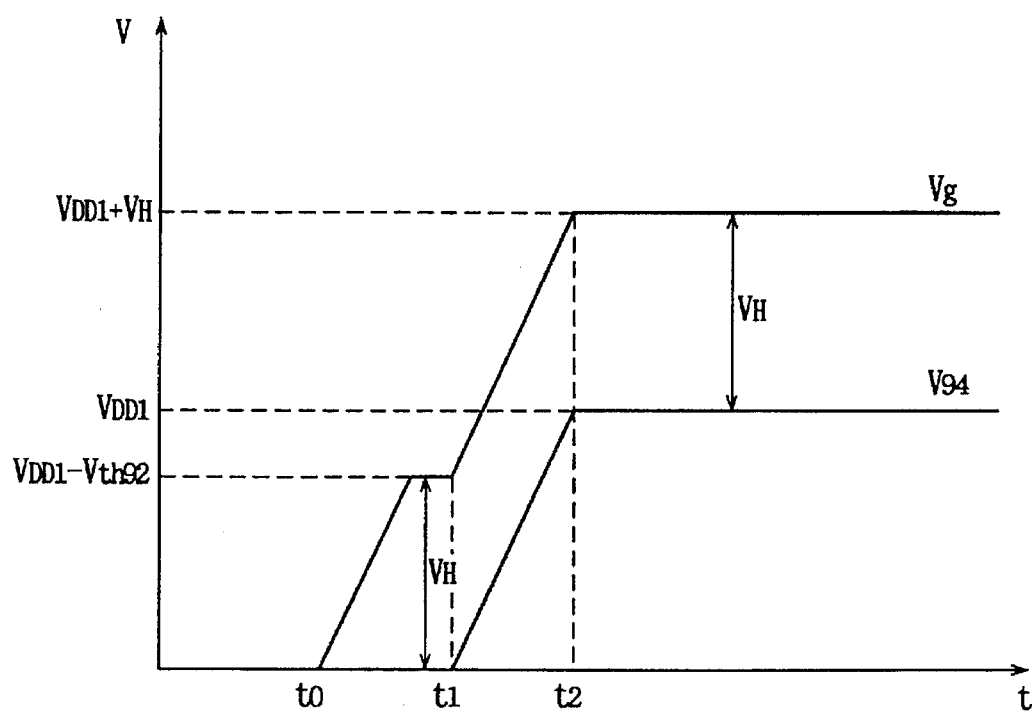
FIG. 9 is a graphic representation illustrating operational changes of the step-up circuit with time.

How the voltage converting circuit 99 operates in this situation will now be described in more detail. FIG. 8 is a circuit diagram of the voltage converting circuit 99 alone. FIG. 9 is a graphic representation illustrating changes over time in the gate potential $V_g$ of the transistor 11 and in the output potential $V_{94}$ of the inverter 94.

In FIG. 9, prior to a time $t_0$, the transistor 92 is off, the transistor 91 is on, and the gate potential $V_g$ of the transistor 11 and the output $V_{94}$ of the inverter 94 are both 0 V. When the time $t_0$ is reached, the transistor 92 is turned on and the transistor 91 is turned off. This causes the potential $V_g$ to start rising. On the other hand, the potential $V_{94}$ remains at 0 V until a delay time corresponding to two inverter stages elapses.

If the threshold voltage of the transistor 92 is assumed to be $V_{th92}$, the transistor 92 remains on until the potential $V_g$ reaches the level of ($V_{dd1} - V_{th92}$). With the potential $V_g$ exceeding that level, the transistor 92 is turned off. This electrically disconnects the charges accumulated in the capacitor 93 from its surroundings. Thereafter, the potential difference across the opposed electrodes of the capacitor 93 remains at a constant value $V_H$ (=$V_{dd1} - V_{th92}$).

At a time t1 in FIG. 9, the inverter output potential $V_{94}$ starts changing from the low to the high level. At a time t2, $V_{94} = V_{dd1}$ and the potential remains constant on that level. At this point, the gate potential $V_g$ of the transistor 11 is raised to the level of ($V_{dd1} - V_H$) because the voltage of the capacitor 94 remains constant at $V_H$. As long as the constant value $V_H$ is greater than the threshold value $V_{th11}$ of the transistor 11, the transistor 11 remains on even if the output potential $V_0$ reaches $V_{dd1}$.

On the other hand, when the output impedance control signal HZ is at the low level, the signals DN and DP are both the inverted logic of the data signal D, as shown in FIG. 7. Thus when the data signal D is at the low level, the transistor 1 is turned off, the transistor 2 is turned on, and the output potential $V_0$ becomes 0 V (i.e., low level). When the data signal D is at the high level, the transistor 2 is turned off, the transistor 1 is turned on, and the transistor 11 is also turned on as described above. This triggers the output of the same potential $V_{dd1}$ as that of the power line. That is, there occurs no decrease in the high-level output potential.

Figures 10, 11:
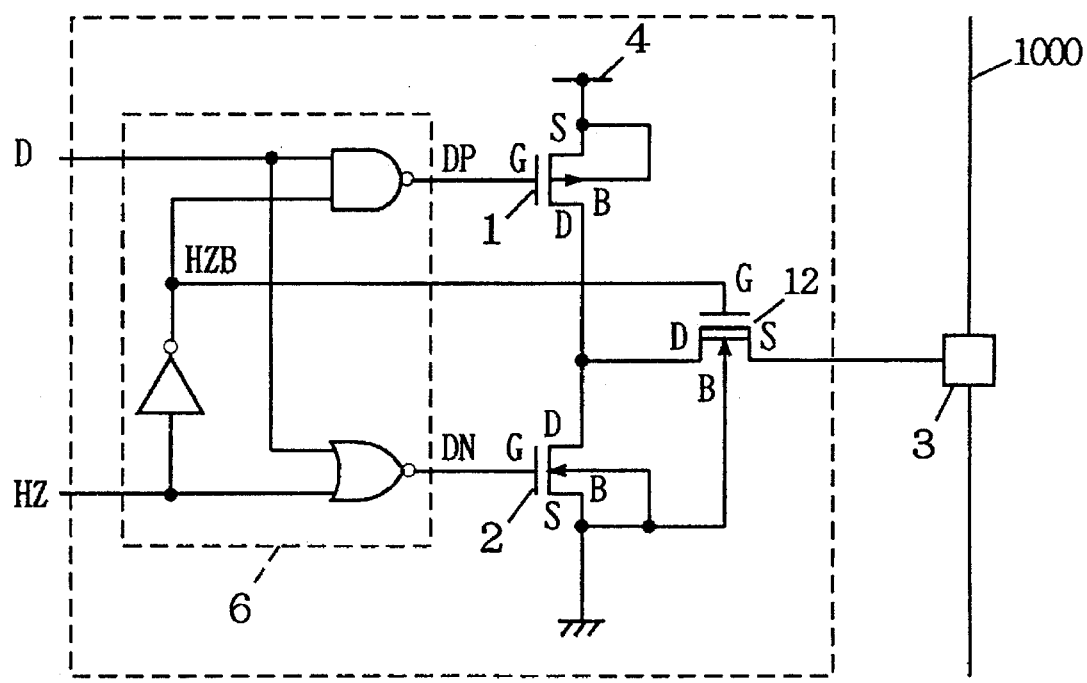
FIG. 10 is a circuit diagram of an output buffer circuit practiced as a fourth embodiment of the invention.
FIG. 11 is a truth table showing how the fourth embodiment operates.

FIG. 10 is a circuit diagram of an output buffer circuit practiced as the fourth embodiment of the invention. In the first embodiment, the depletion type n-channel MOS transistor 10 is interposed between the output node 3 and the p-channel MOS transistor 1 so that the transistors 1, 2 and 10 will be connected serially. By contrast, as shown in FIG. 10, the fourth embodiment has the drain of the p-channel MOS transistor 1 connected with the drain of the n-channel MOS transistor 2. Between the connection point of the two drains and the output node 3, a depletion type n-channel MOS transistor 12 is inserted interposingly. The threshold voltage $V_{th12}$ of the n-channel MOS transistor 12 is set so as to fall within the range of $$-V_{dd1} < V_{th12} < 0 \qquad (3)$$

where $V_{dd1}$ stands for the supply potential (potential of the power line 4) for the output buffer circuit, as in the case of the first embodiment.

How the fourth embodiment works will now be described. The workings of the control circuit 6 and of the transistors 1, 2 and 12 are the same as those in the first embodiment, as shown in FIG. 11.

As shown in FIG. 12, it is n-type semiconductor regions that are connected to the output node 3. Applying a positive voltage to such regions does not cause a forward bias therebetween. Thus no large current flows from the source to the back gate of the n-channel MOS transistor 12. As a result, as long as the output impedance control signal HZ is at the high level, the output of the output buffer circuit remains in the high-impedance state. This prevents the occurrence of a large leak current that is observed in the conventional setup.

FIG. 13 is a circuit diagram of an output buffer circuit practiced as the fifth embodiment of the invention. The second embodiment was shown to have no need for depletion type transistors where the high-level output potential is allowed to be lower than the supply potential $V_{dd1}$, with the result that the number of transistors in the control circuit is reduced. The fifth embodiment improves on the second embodiment by removing the NOR gate from the control circuit 61 thereof.

The constitution and the workings of the fifth embodiment will now be described in more detail with reference to FIGS. 13 and 14. In the second embodiment, the enhancement type n-channel MOS transistor 11 is interposed between the output node 3 and the p-channel MOS transistor 1 so that the transistors 1, 2 and 11 will be connected serially. By contrast, as depicted in FIG. 13, the fifth embodiment has the drain of the p-channel MOS transistor 1 connected with the drain of the n-channel MOS transistor 2. Between the connection point of the two drains and the output node 3, an enhancement type n-channel MOS transistor 13 is inserted interposingly.

Furthermore, the gate of the n-channel MOS transistor 2, together with the gate of the p-channel MOS transistor 1, is driven by the output signal DB of a control circuit 62 in the fifth embodiment. The control circuit 62 consists of two inverters only.

How the control circuit 62 works will now be described with reference to FIGS. 13 and 14. In the control circuit 62, the signal DB is the inverted logic of the data signal D regardless of the value of the output impedance control signal HZ. As with the first embodiment, the signal HZB is the inverted logic of the signal HZ irrespective of the value of the data signal D. Suppose that the output impedance control signal HZ and the data signal D are both at the low level. In that case, the transistor 13 is turned on, and the same logical value as that of the signal D is output to the output node 3. As with the second embodiment, however, the high-level output potential becomes lower than the supply voltage $V_{dd1}$. When the output impedance control signal HZ is driven high, the transistor 13 is turned off. This disconnects the p-channel MOS transistor 1 and n-channel MOS transistor 2 electrically from the output node 3.

That is, the output buffer circuit stays in the high-impedance state regardless of the states of the transistors 1 and 2. In addition, as with the second embodiment, the high-impedance state is maintained even when the potential of the bus 1000 exceeds the supply potential $V_{dd1}$. This is because the output node 3 is connected to the source of the n-channel MOS transistor.

Figures 15, 16:
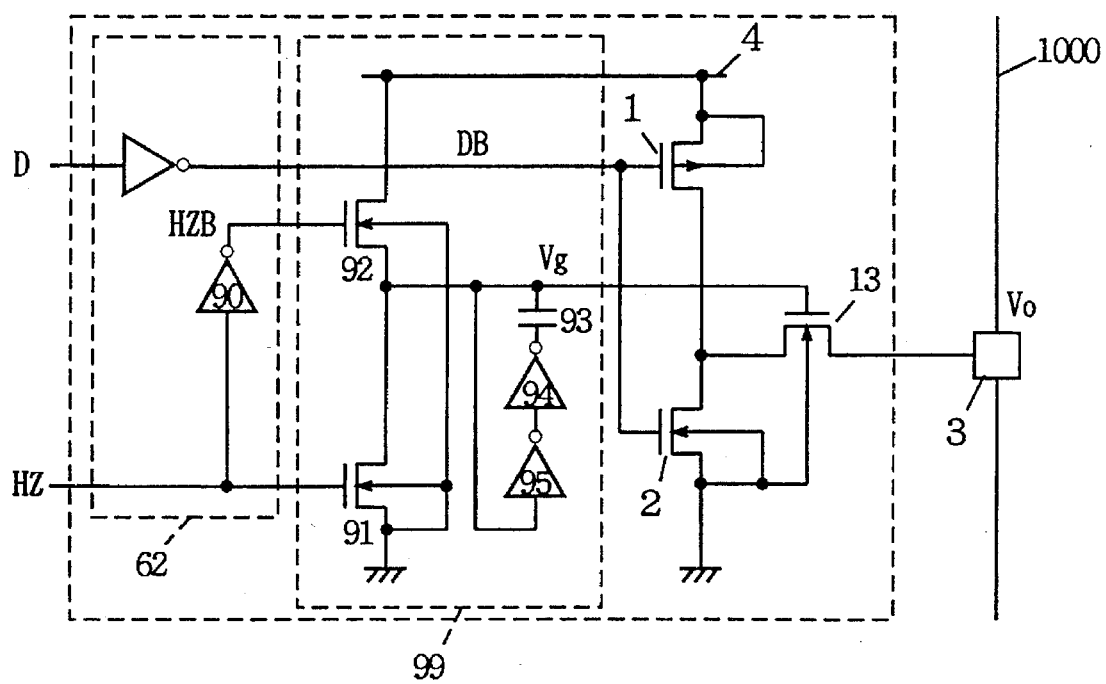
FIG. 15 is a circuit diagram of an output buffer circuit practiced as a sixth embodiment of the invention.
FIG. 16 is a truth table showing how the sixth embodiment operates.

FIG. 15 is a circuit diagram of an output buffer circuit practiced as the sixth embodiment of the invention. The third embodiment was shown to have no need for depletion type transistors with no decrease in the high-level output potential. The sixth embodiment improves on the third embodiment by removing the NOR gate from the control circuit 61 thereof.

The operation and the workings of the sixth embodiment will now be described with reference to FIGS. 15 and 16. In the third embodiment, the enhancement type n-channel MOS transistor 11 is interposed between the output node 3 and the p-channel MOS transistor so that the transistors 1, 2 and 11 will be connected serially. By contrast, as shown in FIG. 15, the sixth embodiment has the drain of the p-channel MOS transistor 1 connected with the drain of the n-channel MOS transistor 2. Between the connection point of the two drains and the output node 3, the enhancement type n-channel MOS transistor 13 is inserted interposingly.

Furthermore, the gate of the n-channel MOS transistor 2, together with the gate of the p-channel MOS transistor 1, is driven by the output signal DB of the control circuit 62 in the sixth embodiment. The control circuit 62 consists of two inverters only. When the output impedance control signal HZ is at the high level, the signal HZB is brought low. This turns on the transistor 91 and turns off the transistor 92. As a result, the gate potential $V_g$ of the transistor 13 becomes 0 V and the transistor 13 is turned off.

Thus as with the third embodiment, the transistor 13 remains off even when the potential of the bus 1000 is 0 V or exceeds the supply potential $V_{dd1}$. This is because the transistor 13 is an enhancement type n-channel MOS transistor. Therefore the output buffer circuit is in the high-impedance state regardless of the states of the p-channel MOS transistor 1 and n-channel MOS transistor 2.

When the output impedance control signal HZ is brought low, the transistor 91 is turned off and the transistor 92 is turned on. As with the third embodiment, the gate voltage $V_g$ of the transistor 13 exceeds the supply voltage $V_{dd1}$.

In the case above, the transistor 13 remains on even if the output potential $V_0$ reaches $V_{dd1}$. On the other hand, when the signal HZ is at the low level, the signals DN and DB are both the inverted logic of the data signal D.

Thus with the data signal D at the low level, the transistor 2 is turned on and the output node 3 outputs 0 V. When the data signal D is at the high level, the transistor 1 is turned on. With the transistor 11 also turned on, the same potential $V_{dd}$ as that of the power line is output. That is, there occurs no voltage reduction in the high-level output signal.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. An output buffer circuit for switching the level of an output signal to one of a first logical level, a second logical level and a high-impedance state in response to an externally supplied data signal and control signal, said output buffer circuit comprising:

a p-channel MOS transistor and a first n-channel MOS transistor connected in series between a first supply potential and a second supply potential and turned on and off in accordance with said externally supplied data and control signal;

a second n-channel MOS transistor inserted in series between said p-channel MOS transistor and said first n-channel MOS transistor and turned on and off in accordance with said externally supplied control signal;

an output node connected to the connection point between said first and said second n-channel MOS transistor; and voltage converting means for generating a signal having a potential higher than the first supply potential in accordance with said externally supplied control signal, wherein said second n-channel MOS transistor is an enhancement type transistor, and the gate of said second n-channel MOS transistor is driven by the signal generated by said voltage converting means.

2. An output buffer circuit for switching the level of an output signal to one of a first logical level, a second logical level and a high-impedance state in response to a data signal and an output impedance control signal which are externally supplied, said output buffer circuit comprising:

a control circuit receiving said data signal and said output impedance control signal, and outputting first, second and third control signals for controlling the state of said output signal;

a p-channel MOS transistor having the gate coupled to receive said first control signal, and the source coupled to receive a first supply potential;

a first n-channel MOS transistor having the gate coupled to receive said second control signal, and the source coupled to receive a second supply potential;

a second n-channel MOS transistor having the gate coupled to receive said third control signal derived from said output impedance control signal, the drain coupled to the drain of said p-channel MOS transistor, and the source coupled to the drain of said first n-channel MOS transistor; and an output node connected to the drain of said first n-channel MOS transistor and to the source of said second n-channel MOS transistor, wherein said second n-channel MOS transistor is an enhancement type transistor;

said first and said second n-channel MOS transistor turning off in response to said second and third control signals, respectively, during activation of said output impedance control signal, said second n-channel MOS transistor turning on, said p-channel MOS transistor and said first n-channel MOS transistor turning on/off complementarily in response to said third, first and second control signals, respectively, during inactivation of said output impedance control signal, and said control circuit includes:

a first inverter having an input coupled to receive said data signal, and an output coupled to the gate of said p-channel MOS transistor;

a two-input NOR circuit having a first input coupled to receive said data signal, a second input coupled to receive said output impedance control signal, and an output coupled to the gate of said first n-channel MOS transistor; and a second inverter having an input coupled to receive said output impedance control signal, and an output coupled to the gate of said second n-channel MOS transistor.

3. An output buffer circuit for switching the level of an output signal to one of a first logical level, a second logical level and a high-impedance state in response to a data signal and an output impedance control signal which are externally supplied, said output buffer circuit comprising:

a control circuit receiving said data signal and said output impedance control signal, and outputting first, second and third control signals for controlling the state of said output signal;

a p-channel MOS transistor having the gate coupled to receive said first control signal, and the source coupled to receive a first supply potential;

a first n-channel MOS transistor having the gate coupled to receive said second control signal, and the source coupled to receive a second supply potential;

a second n-channel MOS transistor having the gate coupled to receive said third control signal derived from said output impedance control signal, the drain coupled to the drain of said p-channel MOS transistor, and the source coupled to the drain of said first n-channel MOS transistor;

an output node connected to the drain of said first n-channel MOS transistor and to the source of said second n-channel MOS transistor; and voltage converting means for generating a signal having potential higher than said first supply potential, wherein the gate of said second n-channel MOS transistor is driven by the signal generated by said voltage converting means, and said second n-channel MOS transistor is an enhancement type transistor, said first and said second n-channel MOS transistor turning off in response to said second and third control signals, respectively, during activation of said output impedance control signal, and said second n-channel MOS transistor turning on, said p-channel MOS transistor and said first n-channel MOS transistor turning on/off complementarily in response to said third, first and second control signals, respectively, during inactivation of said output impedance control signal.

4. An output buffer circuit according to claim 3, wherein said control circuit includes:

an inverter having an input coupled to receive said data signal;

a first output for outputting a signal from said inverter to the gate of said p-channel MOS transistor;

a two-input NOR circuit having a first input coupled to receive said data signal, and a second input coupled to receive said output impedance control signal;

a second output for outputting a signal from said two-input NOR circuit to the gate of said first n-channel MOS transistor;

a logic circuit having an input coupled to receive said output impedance control signal; and a third output for outputting a signal from said logic circuit to said voltage converting means;

wherein said voltage converting means includes switching means for switching, in accordance with the signal from said third output, the output potential of said voltage converting means to one of said second supply potential and a potential converted to be higher than said first supply potential, the output of said voltage converting means being connected to the gate of said second n-channel MOS transistor.

5. An output buffer circuit for switching the level of an output signal to one of a first logical level, a second logical level and a high-impedance state in response to an externally supplied data signal and control signal, said output buffer circuit comprising:
- a p-channel MOS transistor and a first n-channel MOS transistor connected in series between a first supply potential and a second supply potential and turned on and off in accordance with said externally supplied data and control signals;
- an output node; and
- a second n-channel MOS transistor inserted in series between said output node on the one hand, and the connection point between said p-channel MOS transistor and said first n-channel MOS transistor on the other hand, and turned on and off in accordance with said externally supplied control signal, wherein
- said second n-channel MOS transistor is a depletion type transistor.

6. An output buffer circuit for switching the level of an output signal to one of a first logical level, a second logical level and a high-impedance state in response to an externally supplied data signal and control signal, said output buffer circuit comprising:
- a p-channel MOS transistor and a first n-channel MOS transistor connected in series between a first supply potential and a second supply potential and turned on and off in accordance with said externally supplied data and control signals;
- an output node;
- a second n-channel MOS transistor inserted in series between said output node on the one hand, and the connection point between said p-channel MOS transistor and said first n-channel transistor on the other band, and turned on and off in accordance with said externally supplied control signal; and
- voltage converting means for generating a signal having potential higher than the first supply potential in accordance with said externally supplied control signal, wherein
- the gate of said second n-channel MOS transistor is driven by the signal generated by voltage converting means,
- said second n-channel MOS transistor is an enhancement type transistor.

7. An output buffer circuit for switching the level of an output signal to one of a first logical level, a second logical level and a high-impedance state in response to a data signal and an output impedance control signal which are externally supplied, said output buffer circuit comprising:
- a control circuit receiving said data signal and said output impedance control signal, and outputting first, second and third control signals for controlling the state of said output signal;
- a p-channel MOS transistor having the gate coupled to receive said first control signal, and the source coupled to receive a first supply potential;
- a first n-channel MOS transistor having the gate coupled to receive said second control signal, the drain connected to the drain of said p-channel MOS transistor, and the source coupled to receive a second supply potential;
- a second n-channel MOS transistor having the gate coupled to receive said third control signal, and the drain connected to the drain of said p-channel MOS transistor and to the drain of said first n-channel MOS transistor; and
- an output node connected to the source of said second n-channel MOS transistor, wherein said second n-channel MOS transistor is a depletion type transistor,
said p-channel MOS transistor and said first n-channel MOS transistor turning off in response to said first and second control signals respectively, during activation of said output impedance control signal, and
said second n-channel MOS transistor turning on, said p-channel MOS transistor and said first n-channel MOS transistor turning on/off complementarily in response to said third, first and second control signals respectively, during inactivation of said output impedance control signal.

8. An output buffer circuit for switching the level of an output signal to one of a first logical level, a second logical level and a high-impedance state in response to a data signal and an output impedance control signal which are externally supplied, said output buffer circuit comprising:
- a control circuit receiving said data signal and said output impedance control signal, and outputting first, second and third control signals for controlling the state of said output signal;
- a p-channel MOS transistor having the gate coupled to receive said first control signal, and the source coupled to receive a first supply potential;
- a first n-channel MOS transistor having the gate coupled to receive said second control signal, the drain connected to the drain of said p-channel MOS transistor, and the source coupled to receive a second supply potential;
- a second n-channel MOS transistor having the gate coupled to receive said third control signal, and the drain connected to the drain of said p-channel MOS transistor and to the drain of said first n-channel MOS transistor; and
- an output node connected to the source of said second n-channel MOS transistor; and
- voltage converting means for generating a signal having potential higher than said first supply potential, wherein
- the gate of said second n-channel MOS transistor is driven by the signal generated by said voltage converting means,
- said second n-channel MOS transistor is an enhancement type transistor,
- said second n-channel MOS transistor turning off in response to said third control signal during activation of said output impedance control signal, and
- said second n-channel MOS transistor turning on, said p-channel MOS transistor and said first n-channel MOS transistor turning on/off complementarily in response to said third, first and second control signals respectively, during inactivation of said output impedance control signal.

9. An output buffer circuit according to claim 8, wherein said control circuit includes:
- an inverter having an input coupled to receive said data signal;
- a first output for outputting a signal from said inverter to the gate of said p-channel MOS transistor and to the gate of said first n-channel MOS transistor;
- a logic circuit having an input coupled to receive said output impedance control signal; and
- a second output for outputting signal from said logic circuit to said voltage converting means;
- wherein said voltage converting means includes switching means for switching, in accordance with a signal from said second output, the output potential of said voltage converting means to one of said second supply potential and a potential converted to be higher than said first supply potential, the output of said voltage converting means being connected to the gate of said second n-channel MOS transistor.

* * * * *